US005682433A

United States Patent [19]

Pickard et al.

[11] Patent Number: 5,682,433

[45] Date of Patent: Oct. 28, 1997

[54] AUDIO SIGNAL PROCESSOR FOR SIMULATING THE NOTIONAL SOUND SOURCE

[76] Inventors: Christopher James Pickard, 40 Painswick Close, Witney, Oxfordshire, United Kingdom, OX8 5FX; Philip Nicholas Hill, Faircross, Curridge Rd., Newbury, Berkshire, United Kingdom, RG16 9DH

[21] Appl. No.: 556,873

[22] Filed: Nov. 2, 1995

[30] Foreign Application Priority Data

Nov. 8, 1994 [GB] United Kingdom .................... 9422482

[51] Int. Cl.$^6$ .................... H03G 3/00

[52] U.S. Cl. .................... 381/61; 381/17; 381/1

[58] Field of Search .................... 381/17–21, 61, 381/63, 1; 84/600, 601, 630, 661, DIG. 9, DIG. 26, DIG. 27

[56] References Cited

U.S. PATENT DOCUMENTS 4,524,451 6/1985 Watanabe .................... 381/19
4,817,149 3/1989 Myers .................... 381/63
5,208,860 5/1993 Lowe et al. .................... 381/17
5,337,363 8/1994 Platt .................... 381/17
5,436,975 7/1995 Lowe et al. .................... 381/17

FOREIGN PATENT DOCUMENTS 2277239 10/1994 United Kingdom .
WO 91/13497 9/1991 WIPO .
WO93/19467 9/1993 WIPO .

*Primary Examiner*—Curtis Kuntz
*Assistant Examiner*—Ping W. Lee
*Attorney, Agent, or Firm*—Nixon & Vanderhye P.C.

[57] ABSTRACT

An Audio Signal Processing system in which gain values are calculated for a plurality of output channels so that, from a notional listening position, a notional sound source may be perceived as being positioned anywhere within a notional listening space. First gain contributions arranged to make a predominant contribution when the perceived position is close to the notional listening position are calculated. Second gain contributions arranged to make a predominant contribution when the perceived positions are not close to the notional listening position are calculated. The first gain contributions and the second gain contributions are combined to produce combined gain values for each output channel.

22 Claims, 10 Drawing Sheets

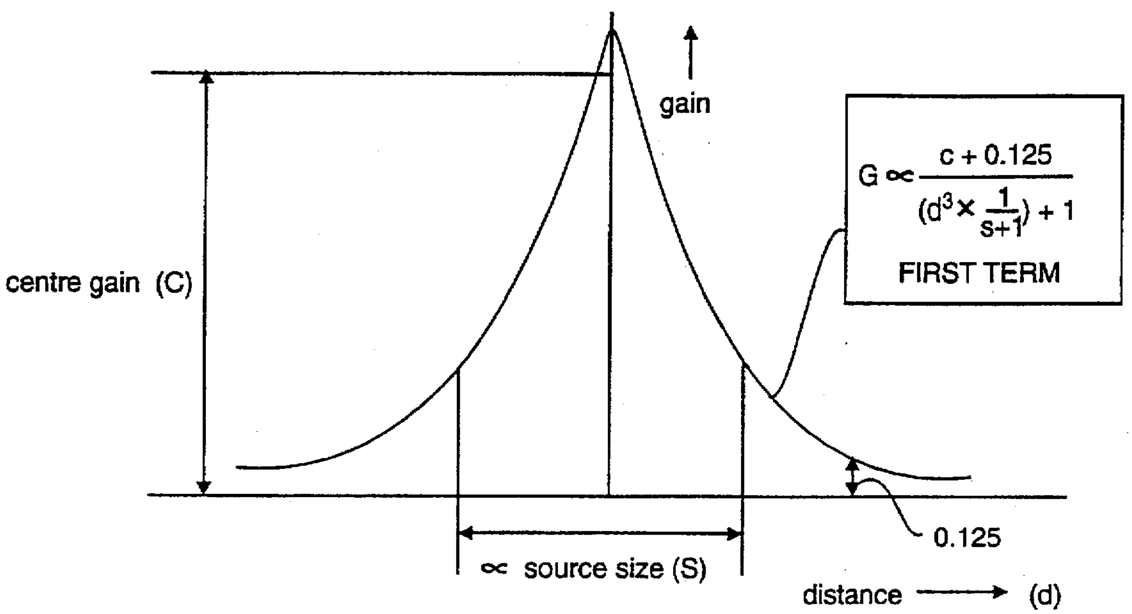
Fig. 7
Fig. 8
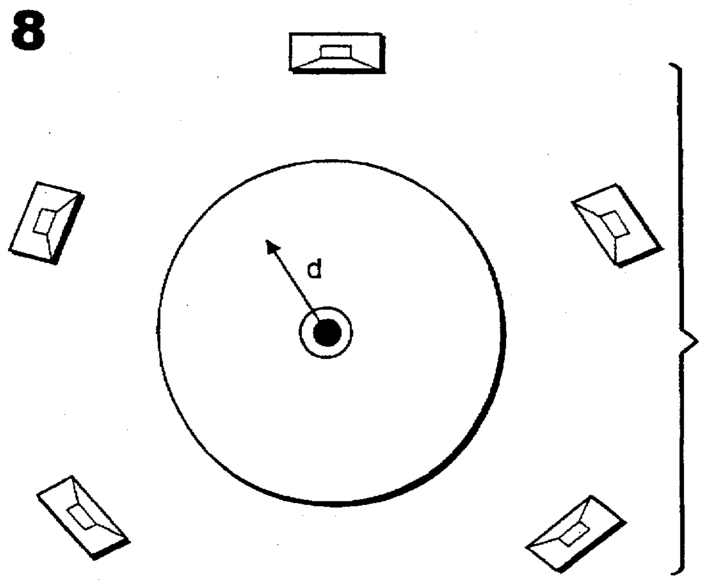

AUDIO SIGNAL PROCESSOR FOR SIMULATING THE NOTIONAL SOUND SOURCE

RELATED APPLICATION

This application is related to copending commonly assigned U.S. application Ser. No. 08/228,353 filed Apr. 15, 1994 (now allowed) corresponding to GB 9307934.1.

FIELD OF THE INVENTION

The present invention relates to audio signal processing. In particular the present invention relates to audio signal processing in which gain values are calculated for a plurality of output channels so that, from a notional listening position, a sound source may be perceived as being positioned anywhere within a notional listening space.

BACKGROUND OF THE INVENTION

A system for mixing five channel sound for an audio plane is disclosed in British patent publication number 2,277,239. The position of a sound source is displayed on a visual display unit (VDU) relative to the position of a notional listener. Sound sources are moved within the audio plane by operation of a stylus upon a touch tablet, allowing an operator to specify positions of a sound source over time, whereafter a processing unit calculates gain values for the five channels at sample rate. Gain values are calculated for each track, for each of the loudspeaker channels and for each of the specified points. Gain values are then produced at sample rate by interpolating calculated gain values at said sample rate.

SUMMARY OF THE INVENTION

According to a first aspect of the present invention there is provided a method of processing audio signals, in which gain values are calculated for a plurality of output channels so that, from a notional listening position, a notional sound source may be perceived as being positioned anywhere within a notional listening space, comprising steps of: calculating first gain contributions arranged to make a predominant contribution when said perceived position is close to the notional listening position; calculating second gain contributions arranged to make a predominant contribution when said perceived position is not close to the notional listening position; and combining respective first gain contributions with respective second gain contributions to produce a combined gain value for each output channel.

BRIEF DESCRIPTION OF THE DRAWINGS

FIGS. 7, 8 and 9 graphically illustrate the nature of the gain calculation illustrated in FIG. 6;

DETAILED DESCRIPTION OF A PREFERRED EMBODIMENT

Figure 1:
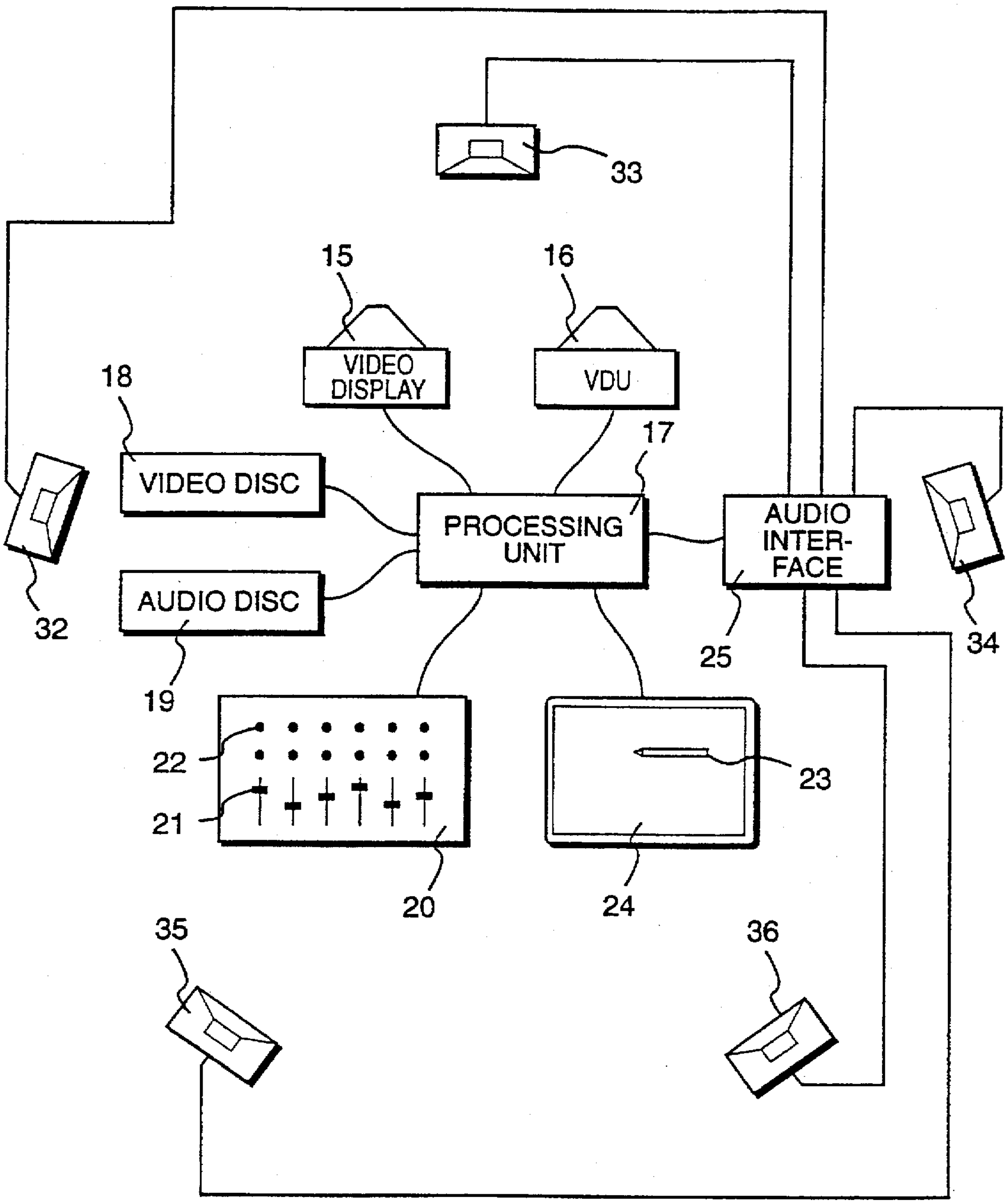
FIG. 1 shows a system for mixing audio signals, including an audio mixing display, input devices and a processing unit.

A system for processing, editing and mixing audio signals and for combining said audio signals with video signals is shown in FIG. 1. Video images and overlaid video related information are displayable on a video monitor display 15, similar to a television monitor. In addition, a computer type visual display unit 16 is arranged to display information relating to audio signals. Both displays 15 and 16 receive signals from a processing unit 17, that in rum receives compressed video data from a video (e.g., magnetic) disc drive 18 and full bandwidth audio signals from an audio disc drive 19.

The audio signals are recorded in accordance with professional broadcast standards at a sampling rate of 48 Khz. Gain control is performed in the digital domain at full sample rate in real time. Manual control is effected via a control panel 20, having manually operable sliders 21 and tone control knobs 22. Information is also supplied via manual operation of a stylus 23 upon a touch tablet 24. Video data is stored on the video storage disc drive 18 in compressed form and said data is decompressed in real time for display on the video display monitor 15 at full video rate. The video information may be encoded as described in the present assignee's co-pending International application published as WO93/19467.

In addition to moving the position of the notional sound source with respect to time, it is also possible to adjust other parameters that influence the overall effect. In particular, the previous system provides means for adjusting sound divergence, that is to say the spread of the sound over a plurality of positions. The previous system also allows a parameter referred to as distance decay to be adjusted, which, as it's name suggests, effectively provides a scaling parameter relating to distance travelled over the display screen to perceived distance travelled by the notional sound source.

In the previously referred system, gain values are calculated with reference to the cosine of the angle theta between the position of an output channel loudspeaker and the position of a notional sound source with reference to the position of the notional listener. It has been found that such a procedure produces valid results when the notional sound source is not close to the position of the notional listener. However, the procedure is less than ideal as the position of the notional sound source moves closer to the position of the notional listener.

The system shown in FIG. 1 provides audio mixing synchronized to video time code. Original images recorded on film, or full bandwidth video, with timecode are converted to a compressed video format to facilitate the editing of audio signals against compressed frames having equivalent timecodes. The audio signals are synchronized to the timecode during the audio editing process, thereby allowing the newly mixed audio to be accurately synchronized and combined with the original film or full bandwidth video.

The audio channels are mixed such that a total of six output channels are generated, each stored in digital format on the audio storage disc drive 19. In accordance with convention, the six channels represent a front left channel, a front central channel, a front right channel, a left surround channel, a right surround channel and a boom channel. The boom channel stores low frequency components which, in the auditorium or cinema, are felt as much as they are heard. The boom channel is not directional and sound sources having direction are defined by the other five full bandwidth channels.

The apparatus shown in FIG. 1 is arranged to control the notional position and movement of sound sources within a sound plane. The audio mixing display 16 is arranged to generate a display showing the spatial arrangement of sound generating devices such as loudspeakers. In addition to the loudspeakers, the position of a notional listener is represented, along with a position of a notional sound source, created by supplying contributions of an original sound source to a plurality of loudspeakers.

The audio display 16 also displays menus, from which particular operations may be selected in response to operation of the stylus 23 upon the touch tablet 24. Movement of the stylus 23, while in proximity to the touch tablet 24, results in the generation of a cross-shaped cursor upon the VDU 16. Menu selection from the VDU 16 is made by placing the cursor over a menu box and thereafter placing the stylus into pressure. The selected condition is identified to the operator by a change in color of that item. Thus, for example, from the menu, an operation may be selected such as to allow the positioning of a sound source within the sound plane. Thereafter, as the stylus is moved over the touch tablet 24, the cross represents the position of a selected sound source and once the desired position has been located, the stylus may be placed into pressure again, resulting in a marker remaining in the selected position. Thus, operation of the stylus in this way effectively instructs the system to the effect that, at specified point in time, relative to the video clip, a particular audio source is to be positioned at the specified point.

In operation, an operator selects a portion of a video clip for which sound is to be mixed. All available input sound data is written to the audio disc storage device 19, at full audio bandwidth, effectively providing randomly accessible sound clips to the operator. Thus, after selecting a particular video clip, the operator may select audio clips to be added to the selected video clip. Once an audio clip has been selected, a fader 21 is used to control the overall loudness of the audio signal and other modifications to tone may be made via the tone controls 22.

By operating the stylus 23 upon the touch tablet 24, a menu selection is made to position the selected sound source within the audio plane. After making this selection, the VDU displays an image allowing the operator to position the sound source within the audio plane. On placing the stylus 23 into pressure, a processing unit 17 is instructed to store that particular position in the audio plane, with reference to the selected sound source and the duration of the selected video clip; after which gain values are generated when the video clip is displayed. Audio tracks are stored as digital samples and the manipulation of the audio data is effected within the digital domain. Consequently, in order to ensure that gain variations are made without introducing undesirable noise, it is necessary to control gain (by direct calculation or by interpolation) for each output channel at sample rate definition. Furthermore, this control must be effected for each originating track of audio information which, in the preferred embodiment, consists of thirty eight originating tracks. For each output signal, derived from each input channel, digital gain signals must be generated at 48 KHz.

Movement of each sound source derived from a respective track, is defined with respect to specified points, each of which define the position of the sound to a specified time. Some of these specified points are manually defined by a user and are referred to as "way points". In addition, intermediate points are also automatically calculated and are arranged such that an even period of time elapses between each of said intermediate points.

After points defining trajectory have been specified, gain values are calculated for the sound track for each of said loud speaker channels and for each of said specified points. Gain values are produced at sample rate for each channel of each track by interpolating the gain values, thereby providing gain values at the required sample rate. A processing unit 17 receives input signals from control devices, such as the control panel 20 and touch tablet 24 and receives stored audio data from the audio disc storage device 19. The processing unit 17 supplies digital audio signals to an audio interface 25, that in turn generates five analog audio output signals to the five respective loudspeakers 32, 33, 34, 35 and 36.

Figure 2:
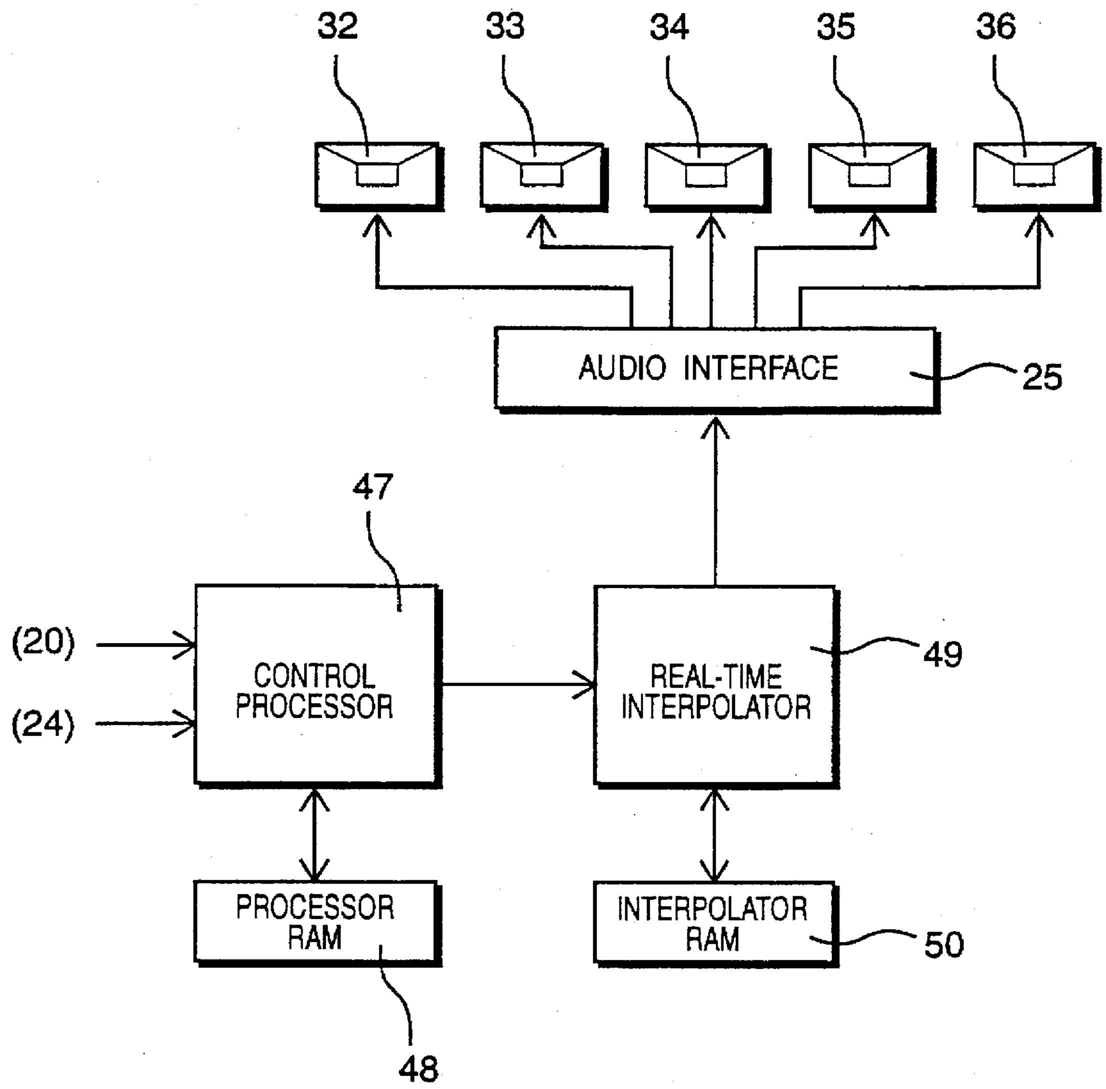
FIG. 2 details the processing unit shown in FIG. 1, including a control processor and a real-time interpolator.

The processing unit 17 is detailed in FIG. 2 and includes a control processor 47 with it's associated processor random access memory (RAM) 48, a realtime interpolator 49 and it's associated interpolation RAM 50. The control processor 47 is based on a Motorola 68300™ thirty two bit floating point processor or a similar device, such as a MACINTOSH QUADRA™ or an INTEL 80486™ processor. A control processor 47 is essentially concerned with processing non-real-time information, therefore it's speed of operation is not critical to the real-time performance of the system; however it does affect the speed of response to operator instructions.

The control processor 47 oversees the overall operation of the system and the calculation of gain values is one of many tasks. The control processor calculates gain values associated with each specified point, consisting of user defined waypoints and calculated intermediate points. The trajectory of the sound source is approximated by straight lines connecting the specified points, thereby facilitating linear interpolation performed by the realtime interpolator 49.

Sample points on linearly interpolated lines have gain values which are calculated in response to a straight line equation, $y=mt+c$. During real-time operation, values for $t$ are generated by a clock in real-time and precalculated values for the interpolation equation parameters ($m$ and $c$) are read from storage. Thus equation parameters are supplied to the real-time interpolator 49 from the control processor 47 and written to the interpolator's RAM 50. Such a transfer of data is effected under the control of the processor 47, which perceives RAM 50 (associated with the real-time interpolator) as part of it's own addressable RAM, thereby enabling the control processor to access the interpolator's RAM 50 directly.

The control processor 47 provides an interactive environment under which a user may adjust the trajectory of a sound source and modify other parameters associated with sound sources stored within the system. Thereafter, the control processor 47 is required to effect non-real-time processing of signals in order to update the interpolator's RAM 50 for subsequent use during realtime interpolation.

The control processor 47 presents a menu to an operator, allowing operators to select a particular audio track and to adjust parameters associated with that track. Thereafter, the trajectory of a sound source is defined by the interactive modification of waypoints.

Figure 3:
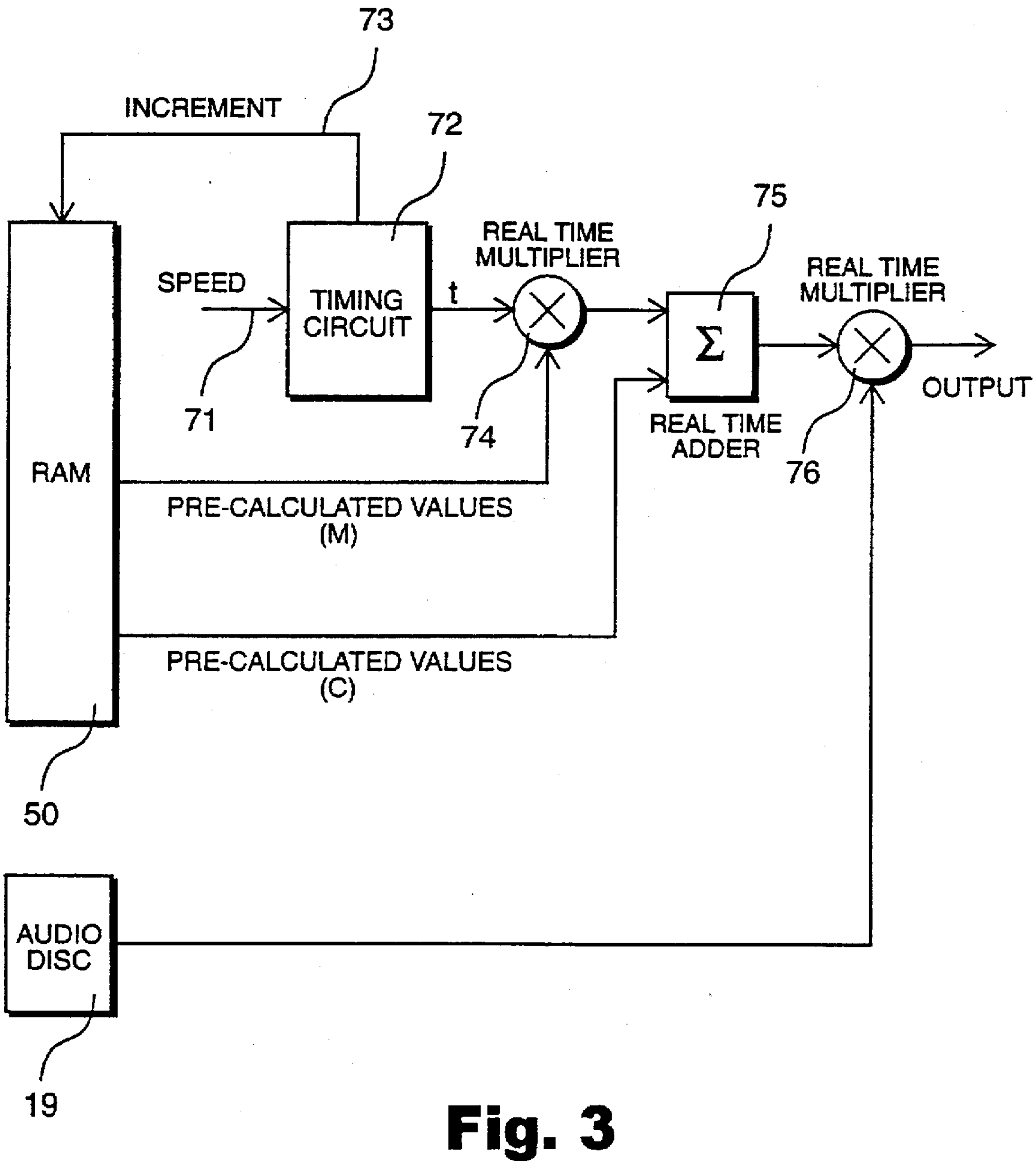
FIG. 3 details operation of the real-time interpolator shown in FIG. 2.

The real-time interpolator 49 is shown in FIG. 3, connected to it's associated interpolator RAM 50 and audio disc 19. When the realtime interpolator is activated in order to run a clip, a speed signal is supplied to a speed input 71 of a timing circuit 72. The timing circuit supplies a parameter increment signal to RAM 50 on increment line 73, to ensure that the correct address is supplied to the RAM for addressing the precalculated values for m and c. In addition, the timing circuit 72 also generates values of t, from which the interpolated values are derived.

Movement of the sound source is initiated from a particular point, therefore the first gain value is known. In order to calculate the next gain value, a precalculated value for m is read from the RAM 50 and supplied to a real-time multiplier 74. The real-time multiplier 74 forms the product of m and t, whereafter said product is supplied to a real-time adder 75. At said real-time adder 75 the output from the multiplier 74 is added to the relevant precalculated value for c, resulting in a sum that is supplied to a second real-time multiplier 76. At the second real-time multiplier 76 the product is formed between the output of real-time adder 75 and the associated audio sample, read from the audio disc 19.

Audio samples are produced at a sample rate of 48 Khz and it is necessary for the real-time interpolator to generate five channels worth of digital audio signals at this sample rate. In addition, it is necessary for the real-time interpolator to effect this for all of the thirty eight recorded tracks. In order to achieve this level of calculation, the devices as shown in FIG. 3 are consistent with the IEEE 75432 bit floating point protocol, capable of calculating at an effective rate of twenty million floating point operations per second.

Figure 4:
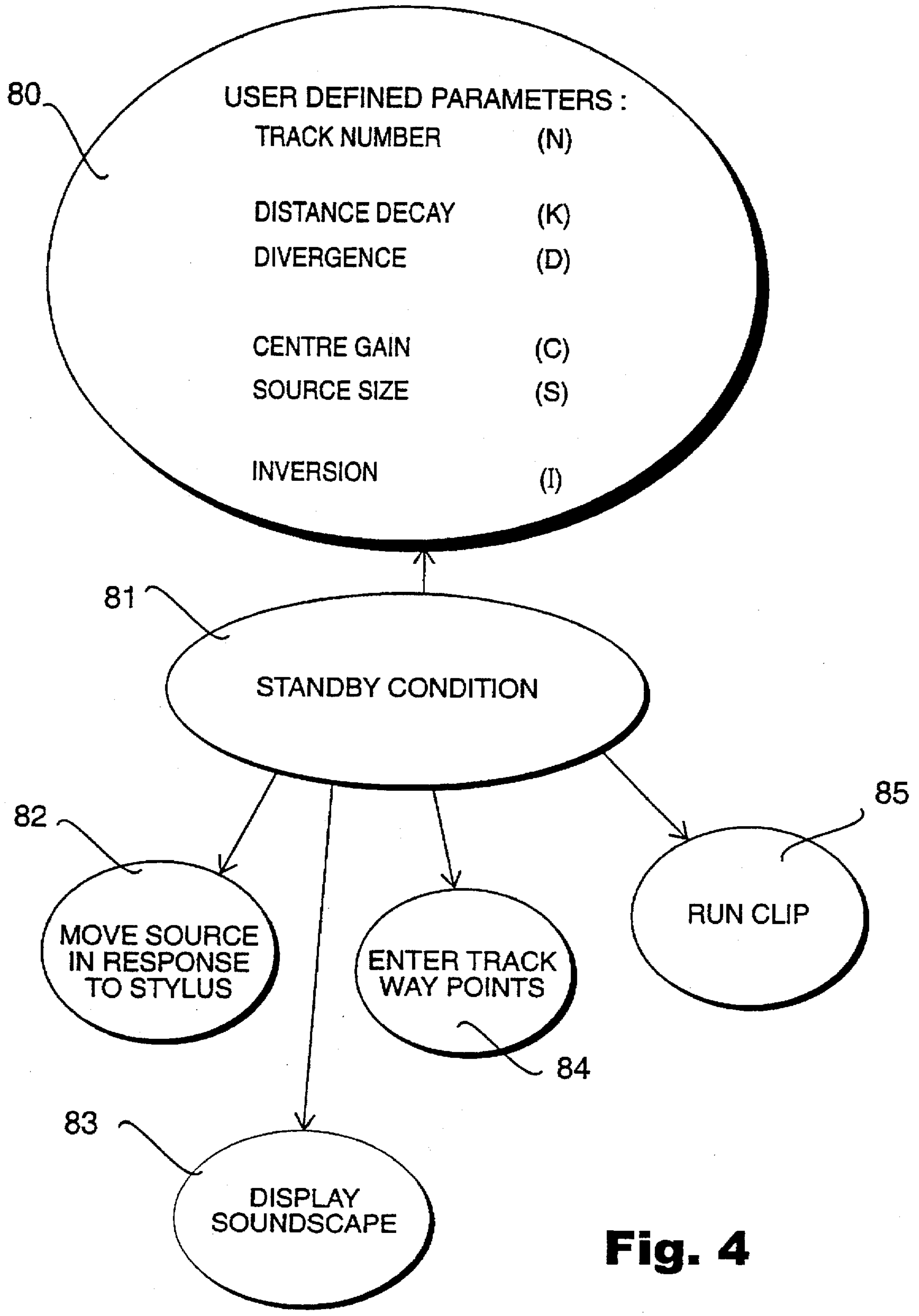
FIG. 4 illustrates modes of operation available to an operator, under the control of the control processor shown in FIG. 2.

Under control of the control processor 47, the system is capable of operating in a plurality of modes, as illustrated in FIG. 4. Thus, from an initial standby condition 81, it is possible for a user to define parameters, as identified by operational condition 82. In addition, it is possible for the stylus 23 to be moved over the touch tablet 24 while listening to a particular input sound source, resulting in the notional sound source position being moved interactively in response to movement of the stylus.

Condition 83 creates a display of what may be referred to as a "soundscape". The adjustment of parameters under condition 82 changes the way in which a sound is perceived as it is positioned within the space displayed on the display unit 16. Thus the visual display 16 provides a visual representation of the sound generating loudspeakers, a notional listening position and a space within which the perceived sound source may be located.

The processing unit, when operating under condition 83, modifies the visual characteristic of the displayed space at selectable positions so as to represent a characteristic relevant to sound generating devices when the perceived sound source is located at said selectable positions. Thus, when the notional sound source is placed at a particular location, the gain for a particular loudspeaker will be adjusted so as to create the impression that the sound source originates from that location. Thus, the gain of any particular loudspeaker will vary depending upon the position of the sound source. Furthermore, the actual relationship between position and gain will also depend upon the parameters specified at condition 82, particularly, the parameters specifying distance decay, divergence, centre gain and source size.

Selection of condition 85 provides for the selected clip to run. During the running of a clip, interpolated gain values are calculated in real-time, thereby the effect may be presented to an operator in real-time and recorded, if required, in real-time.

When moving the source in response to operation of the stylus, calculating luminance values for the soundscape or running a clip, it is necessary to calculate gain values for each sound generating loudspeaker. In order to achieve this, it is necessary to calculate gain values for loudspeakers as a function of the position of the notional sound source, in addition to user defined parameters.

Figure 5:
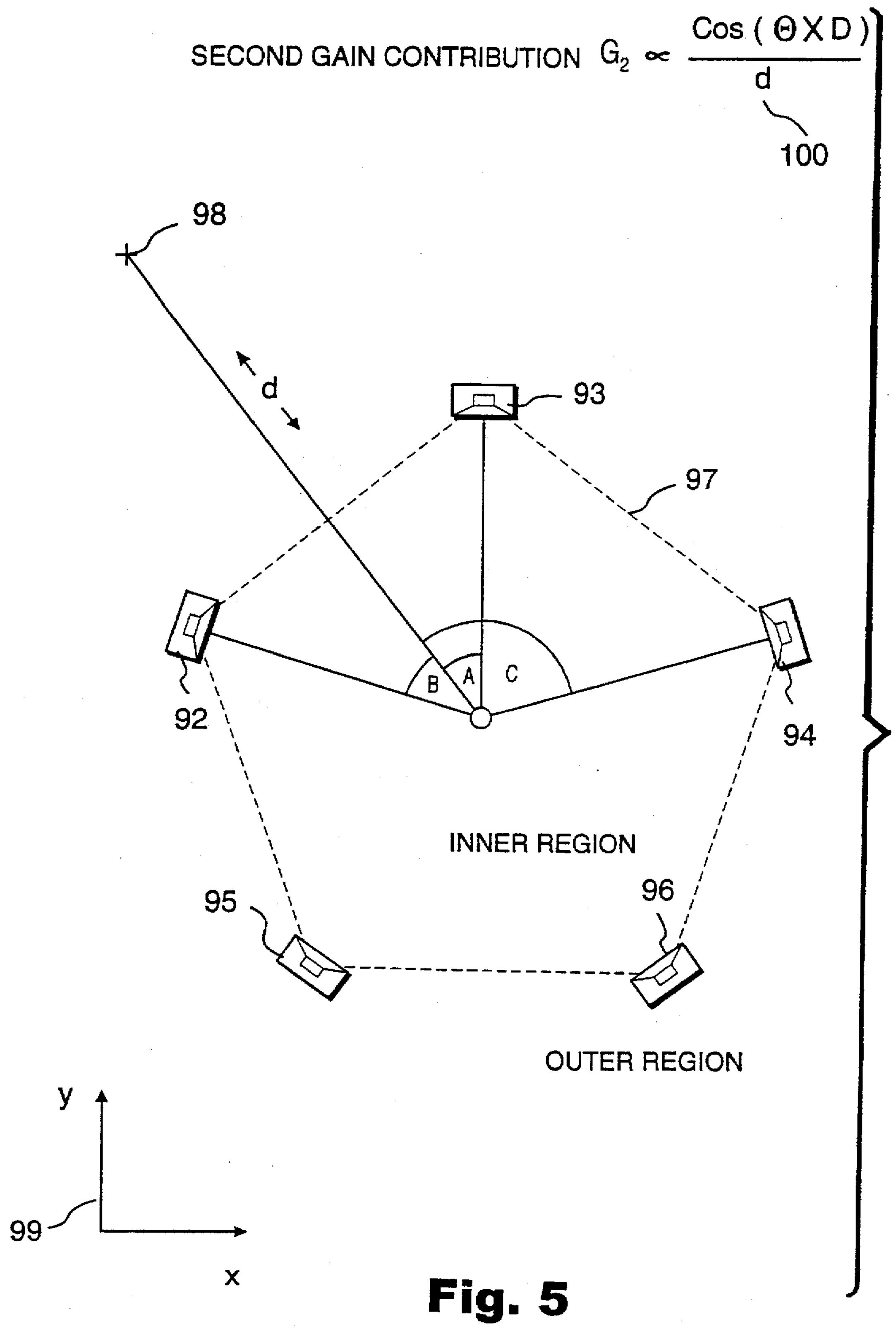
FIG. 5 illustrates a gain calculation that is predominant when the notional sound source position is not close to the notional listening position.

An arrangement of loudspeakers similar to that displayed on the visual display unit 16, is illustrated in FIG. 5. The loudspeaker positions are identified by icons 92, 93, 94, 95 and 96, which map onto the physical loudspeakers 32, 33, 34, 35 and 36 of FIG. 1 respectively. A pentagonal outline 97 connects the icons representing the loudspeakers and effectively provides a boundary between a inner region, bounded by the loudspeaker positions and an outer region external to said loudspeaker positions.

A notional sound source position is identified by cursor 98. The position of this sound source is selectable by the operator, by operation of the stylus 23 upon the touch tablet 24. Thus, by operation in this way, the cursor 98 has been placed at the position shown in FIG. 5.

Images displayed on the visual display unit 16 are created by reading video information from a frame store at video rate. The frame store is addressed in order to identify locations within it, therefore any position within the frame of reference under consideration has a direct mapping to a location within the frame store. Thus, each position shown within FIG. 5 may be identified with respect to a coordinate frame of reference, giving it a Cartesian location specified by x and y coordinates, as represented by the x and y axis 99.

FIG. 5 relates to the calculation of gain contributions, that are arranged to make a predominant contribution when said perceived sound source position is not close to the notional listening position. In addition, gain contributions are also calculated which make a predominant contribution when the perceived sound source position is close to the notional listening position. Thereafter, these two gain contributions are combined to produce a combined gain value for each output channel. In accordance with the terminology used herein, the gain contribution is arranged to make a predominant contribution when the perceived position of the sound source is close to the notional listening position will be referred to as the first gain contribution G1. Similarly, the gain contribution arranged to make a predominant contribution when the perceived sound source is not close to the notional listening position will be referred to as the second gain contribution G2.

FIG. 5 illustrates the principle for calculating the second gain contribution and, as appreciated with reference to FIG. 5, it tends to produce non zero gain values for the three loud speaker output positions closest to the notional sound source position. Thus in FIG. 5 with the notional sound source located at position 98, positive gain contributions will be made for loudspeakers 92, 93 and 94. Gain values may be calculated for loudspeakers 95 and 96 but, in accordance with the procedure, these gain values will be zero or at least very close to zero.

As illustrated by relationship 100, the second gain contribution G2 varies with the cosine of the product of the angle theta with sound divergence D divided by distance d from the notional sound source position to the position of the notional listener. Thus, as can be appreciated with reference to FIG. 5, angle theta is equal to angle B when calculating a gain contribution for loudspeaker 92, angle theta is equivalent to angle A when calculating a contribution for loudspeaker 93 and angle theta is equal to angle C when calculating a contribution for loudspeaker 94.

Figure 6:
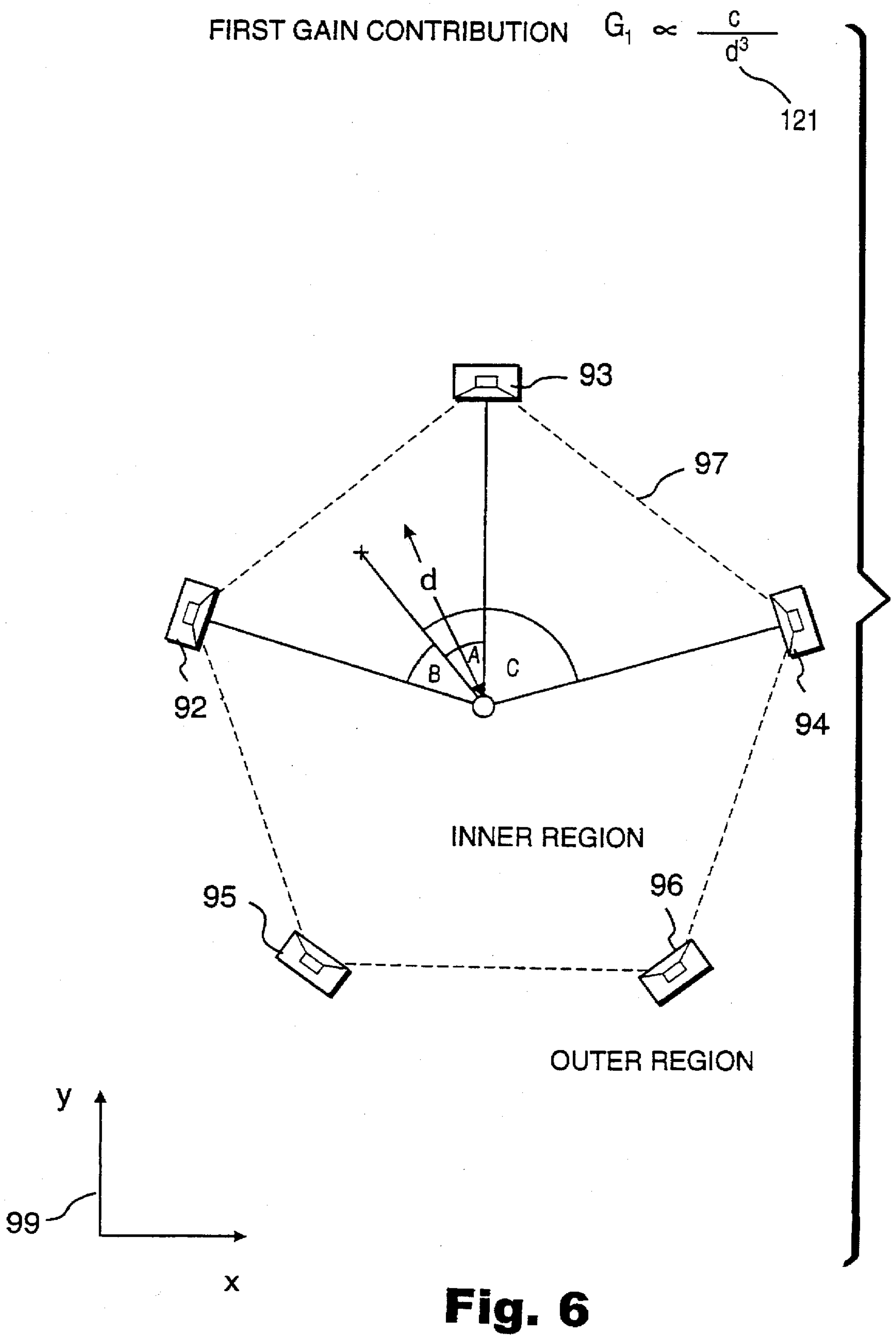
FIG. 6 illustrates a gain calculation that is predominant when the notional sound source position is close to the notional listener.

The principle for the calculation of the first gain contribution is shown in FIG. 6. The first gain contributions are predominant when the notional sound source is close to the notional listening position. Positions close to the notional listening position may be considered as those bounded by the polygonal region defined by the physical sound generating sources. As shown in FIG. 6, the region outside this polygonal area may be referred to as the outer region, which identifies the region where gain contributions of the second type are predominant.

When the notional sound source is located within the inner region, that is close to the notional listening position, gain contributions are generated for all of the sound generating channels. An overall centre gain value c is specified by a user under operation 80 shown in FIG. 4. The distance value d between the position of notional listener and the position of the notional sound source is calculated. As shown by relationship 121, the first gain contribution effectively varies inversely with the cube of the distance d. Thus, for each loudspeaker channel, a gain contribution is calculated which varies with a central gain value divided by the cube of the respective distance d.

Figure 9:
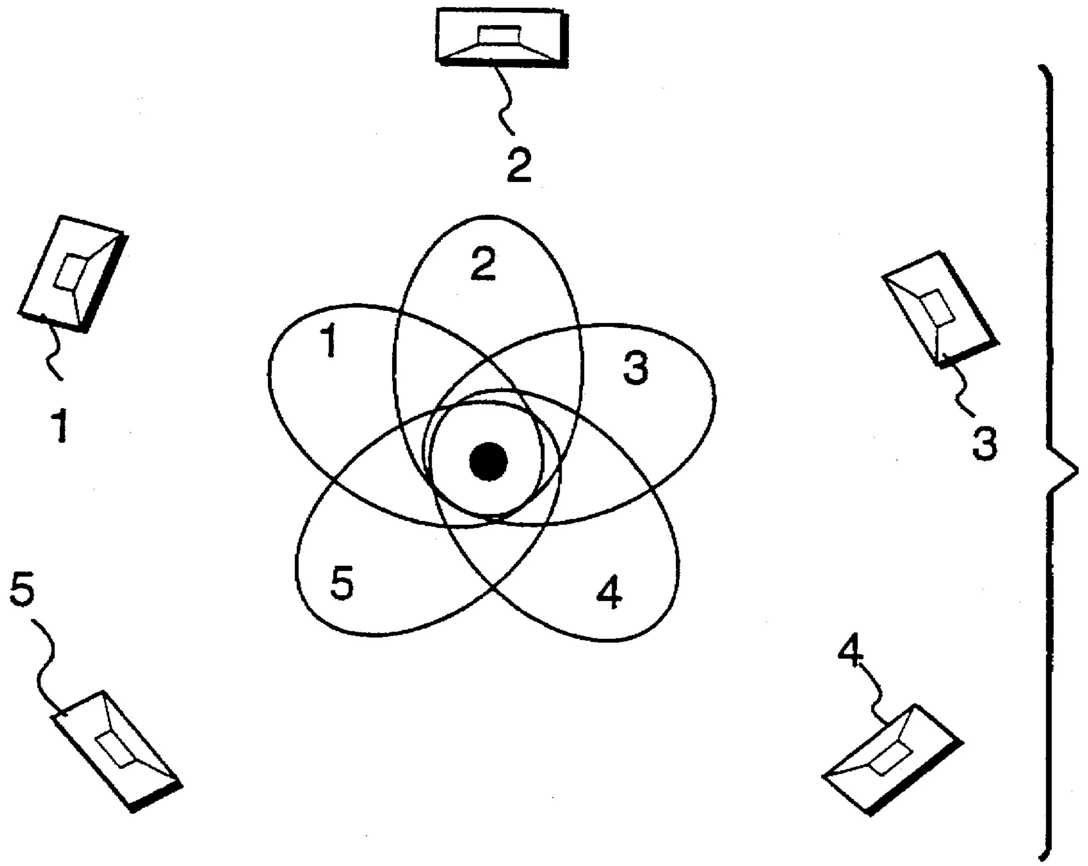

The first gain contribution, predominant when the notional sound source is close to the notional listening position, is itself made up of two terms. The effects of these terms is illustrated in FIGS. 7, 8 and 9. The first term is illustrated in FIG. 7, which is proportional to one over the cube of the distance d, with additional terms to effect scaling and to prevent overflow. The function is plotted graphically in FIG. 7, with gain plotted against distance d and, as can be seen from FIG. 7, various parameters affect the actual shape of the resulting curve. For example, the centre gain value is equivalent to the height of the curve, the source size can be seen as the width between the two points of the inflection and along the ordinate axis the curve approaches the value 0.125.

The result of this function when overlaid over the loudspeaker positions is illustrated in FIG. 8. Thus, the first term produces an area around a listener of increasing gain. As a sound source approaches the notional listening position the value of d decreases, therefore the gain value increases. Similarly, as the distance d from the notional listening position to the notional sound source position increases, this value cubed soon gets large, therefore the centre gain value rapidly diminishes, as illustrated in FIG. 7.

It can be appreciated from FIGS. 7 and 8 that the first term for the centre gain contribution reflects the absolute distance of the notional sound source from the notional listener but does not make any reference to the position of the sound source relative to the loudspeakers. In order to take account of the loudspeaker positions and to introduce improved spatial positioning, a second term effectively offsets the area shown in FIG. 8 for each of the respective loudspeaker positions 1, 2, 3, 4 and 5.

Gain contributions are calculated for each channel in accordance with the procedures identified in FIG. 5 and the procedures identified in FIG. 6. The first gain contribution G1 makes a predominant contribution when the notional sound source position is close to the position of the notional listener. Similarly, the second gain contribution G2 makes a predominant contribution when the notional sound source is not close to the notional listener. These two gain contributions G1 and G2 are then effectively cross-faded in order to produce a combined gain value G for each respective input sound source and for each respective output sound channel.

The control processor 47 is called upon to calculate actual gain values which may be supplied to the real-time interpolator 49, so as to effect gain control at sample rate in real-time. It is also possible that actual gain values may be required for the other processes performed by the control processor 47, as identified in FIG. 4. When called upon to calculate an actual gain value, the control processor 47 executes procedures identified in FIG. 10.

Figure 10:
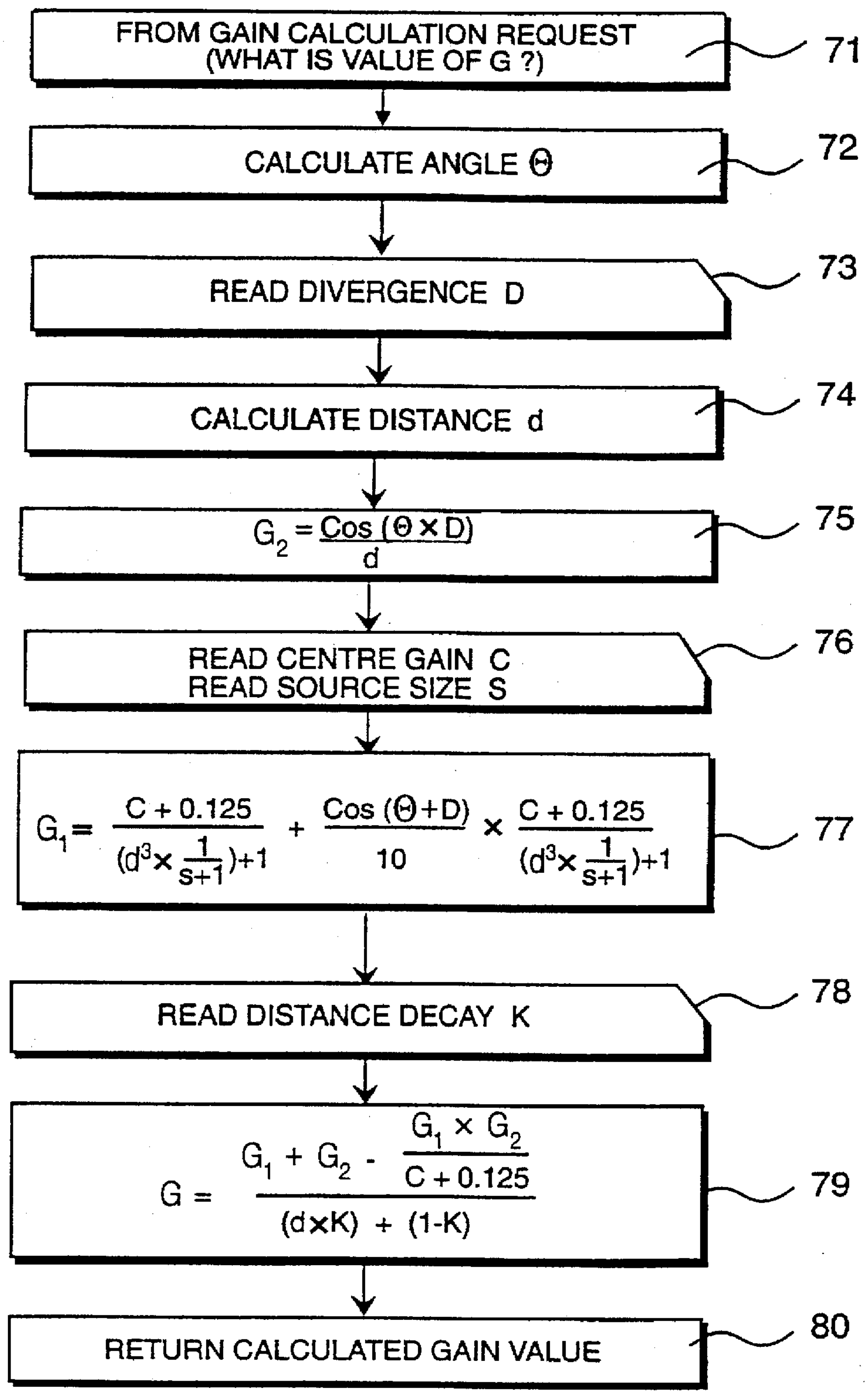
FIG. 10 details procedures performed by the control processor shown in FIG. 2, in order to calculate gain values derived from first and second gain contributions; and, FIG. 11 illustrates the entry track of way points, as identified in FIG. 4, so as to create a sound effect.

Referring to FIG. 10, a request for a gain calculation to be executed is identified generally at step 71. The procedure for gain calculation may be generalized as follows. Firstly, for a particular gain value, the second gain contribution G2 is calculated, as illustrated in FIG. 5. Secondly, the first gain contribution is calculated, as illustrated in FIG. 6. Thereafter, the third and final stage includes combining the two gain contributions to provide a combined gain value G that is returned for subsequent processing.

At step 72 the angle theta is determined by a dot product vector calculation. At step 73 the divergence D is read and at step 74 the distance value d is calculated and at step 75 the second gain contribution G2 is calculated from the cosine of the angle theta added to the divergence angle D. At step 76 the centre gain value C and the source size value s are read.

At step 77 the first gain contribution is calculated. As shown in step 77 and described with reference to FIGS. 7, 8 and 9, the first gain contribution is itself made up of two terms. The first term, producing the functional relationship illustrated in FIG. 7, consists of a numerator derived by adding 0.125 to the centre gain value c. This numerator is then divided by a denominator consisting of the distance d cubed and multiplied by one over the sound source size plus one. Unity is added to the denominator which is then divided into the numerator, consisting of the centre gain value plus 0.125.

The second term for the first gain contribution consists of the previously calculated term multiplied by the cosine of the angle theta plus the divergence angle D divided by ten. These two terms are added together to provide the first gain contribution G1.

At step 78 the distance decay k is read, whereafter at step 79 the two gain contributions are effectively cross faded to produce an overall gain value G. A numerator contribution is derived from the product of G1 and G2, divided by the centre gain value c plus the constant 0.125. The first gain value G1 is added to the second gain value G2 and said numerator contribution is subtracted therefrom. This resulting numerator is divided by a denominator, calculated by adding two components including distance decay. The first component consists of the product of distance d by the distance decay k and the second consists of the distance value k subtracted from unity. Thus, the overall gain value G is calculated as shown at step 79 and returned to calling procedures at step 80.

Way points may be specified after selecting condition 84. Manual selection via the VDU 16 is made by placing a cross over a menu box and placing the stylus into pressure. The fact that a particular menu item has been selected is identified to the operator via a changing color of that item. Thus from the menu an operator may select operation 84 and thereafter position the sound anywhere within the available space for any point in time.

The stylus is moved over the touch-tablet 24, resulting in cross 37 being placed at a location representing the position of the selected sound source. Once the desired position has been located, the stylus is placed into pressure and a marker thereafter remains at the selected position. This operation creates data to the effect that at specified point in time, relative to the video clip, a particular audio source is to be positioned at a specified point in space and a time code may be specified via the keyboard or similar device.

It is necessary for an operator to select a portion of a video clip for which sound is to be mixed. Input sound data is written to the audio disc storage device 19, at full audio bandwidth, thereby making this data randomly accessible. After selecting a particular video clip the operator may then select an audio signal which is to be associated, via time code, with the selected video. Slider 21 is used to control the overall loudness of the audio signal and modifications to the tone of the signal are made using controls 22.

Figure 11:
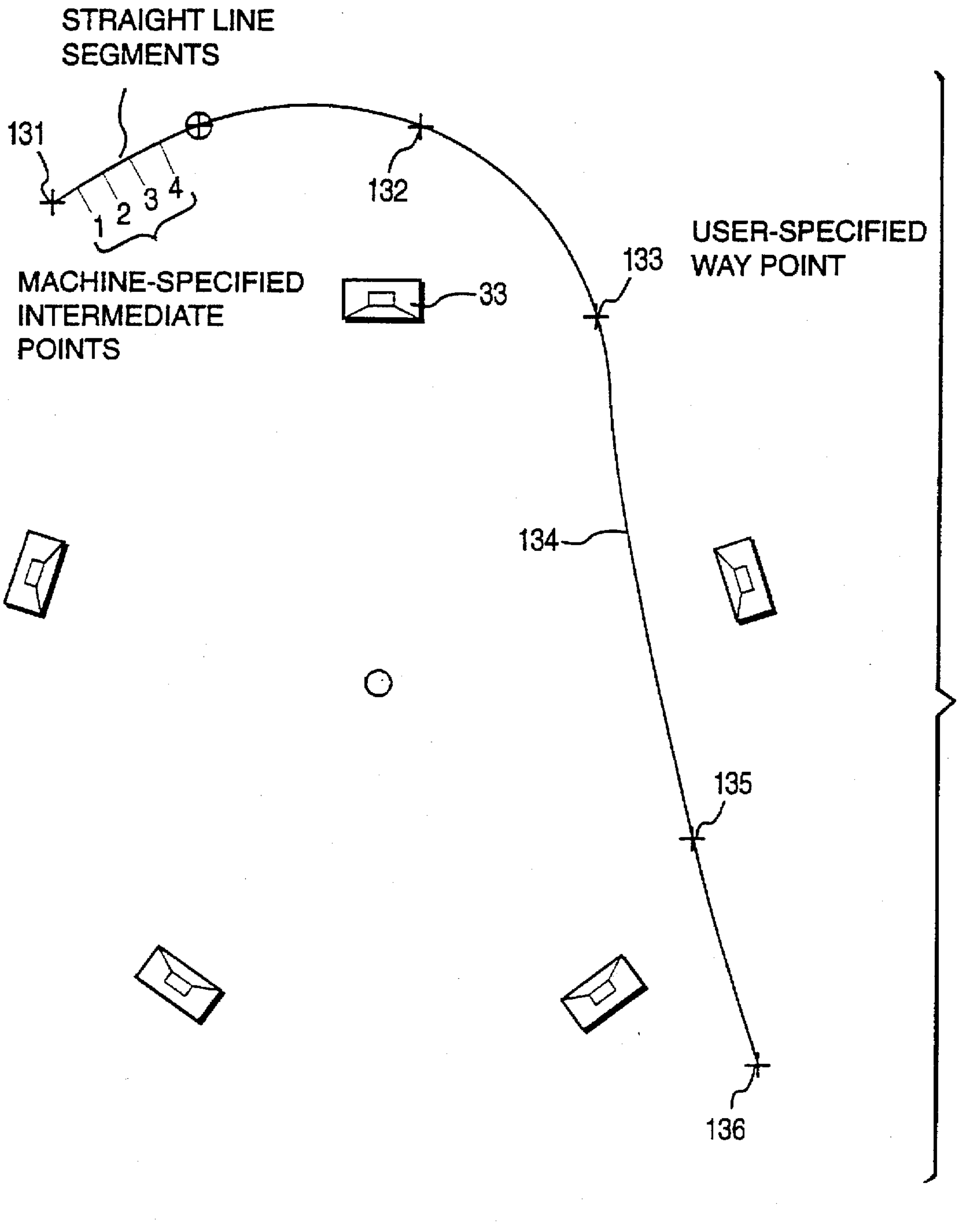

As shown in FIG. 11, a user may specify way points 131, 132, 133, 134, 135 and 136. These selected points are connected by a spline defined by an additional machine-defined intermediate points, identified as 1, 2, 3 and 4 in FIG. 11. During real-time operation, gain values are generated at sample rate by linear interpolation. The, line segments between the machine-specified points are connected by a plurality of straight-line segments.

The present invention facilitates the generation of information relating to the movement of sound in three dimensional space or over a two dimensional plane. Gain values, or other audio-related values, are calculated at specified locations over a plane and a visual characteristic is modified in order to visually represent variations in the audio characteristics. Thus, in the present embodiment, Variations in signal gain are shown as luminance variations although any audio characteristic that may be varied with respect to perceived position may be displayed by modifying any visually identifiable characteristic, such as color or saturation etc.

What we claim is:

1. A method of processing audio signals, in which direct acoustic path gain values are calculated for a plurality of output channels so that, from a notional listening position, a notional sound source is perceived as being positioned at a particular position within a notional listening space said method comprising steps of:

calculating first direct acoustic path gain contributions, said first direct acoustic path gain contributions making a predominant contribution when said perceived position is close to the notional listening position;

calculating second direct acoustic path gain contributions, said second direct acoustic path gain contributions making a predominant contribution when said perceived position is not close to the notional listening position; and combining respective first gain contributions with respective second gain contributions to produce a combined gain value for each output channel.

2. A method according to claim 1, wherein the first gain contribution varies inversely with distance between the notional listening position and the notional sound source position raised to a predetermined power.

3. A method according to claim 1, wherein said first gain contributions are separately calculated for each of a plurality of sound generating means.

4. A method according to claim 1, wherein said second gain contributions vary with a function of an angle between the notional sound source and a respective sound generating means with respect to a position of a notional listener.

5. A method according to claim 4, wherein said function is the cosine of said angle.

6. A method, of processing audio signals, in which gain values are calculated for a plurality of output channels so that, from a notional listening position, a notional sound source may be perceived as being positioned anywhere within a notional listening space, said method comprising steps of:

calculating first gain contributions, said first gain contributions making a predominant contribution when said perceived position is close to the notional listening position;

calculating second gain contributions, said second gain contributions making a predominant contribution when said perceived position is not close to the notional listening position; and combining respective first gain contributions with respective second gain contributions to produce a combined gain value for each output channel;

wherein the first gain contribution varies inversely with distance between the notional listening position and the notional sound source position raised to a predetermined power; and wherein said distance is cubed, such that said first gain characteristic varies inversely with the cube of distance between the notional sound source and the notional listening position.

7. A method of processing audio signals, in which an inner listening space is bounded by a plurality of sound generating devices, a notional listening position is located within said inner listening space, and a notional sound source may be perceived from said notional listening position as being anywhere within said listening space, said method comprising steps of:

calculating a gain value for a first sound generating means, wherein said gain value includes one component that varies inversely with the distance of the notional sound source from said notional listening position raised to a predetermined power and another component that varies inversely with said distance;

calculating a second gain value for a second sound generating means, wherein said second gain value includes one component which varies inversely with the distance between the notional sound source and said notional listening position raised to a predetermined power and another component that varies inversely with said distance; and calculating a third gain value for a third sound generating means, wherein said third gain value includes one component that varies inversely with the distance of the notional sound source from said notional listening position raised to a predetermined power and another component that varies inversely with said distance.

8. A method according to claim 7, further comprising steps of:

calculating a fourth gain value for a fourth sound generating means, wherein said fourth gain value varies inversely with the distance of the notional sound source from the notional listening position.

9. A method according to claim 8, further comprising steps of:

calculating a fifth gain value for a fifth sound generating means, wherein said fifth gain value varies inversely with the distance of the notional sound source from said notional listening position.

10. A method of processing audio signals, in which an inner listening space is bounded by a plurality of sound generating devices, a notional listening position is located within said inner listening space, and a notional sound source may be perceived from said notional listening position as being anywhere within said listening space, said method comprising steps of:

calculating a gain value for a first sound generating means, wherein said gain value varies inversely with the distance of the notional sound source from said notional listening position raised to a predetermined power; and calculating a second gain value for a second sound generating means, wherein said second gain value varies inversely with the distance between the notional sound source and said notional listening position on raised to a predetermined power; and calculating a third gain value for a third sound generating means, wherein said third gain value varies inversely with the distance of the notional sound source from said notional listening position raised to a predetermined power;

wherein said gain values vary inversely with said distance cubed.

11. Apparatus for processing audio signals, in which gain values are calculated for a plurality of channels so that, from a notional listening position, a notional sound source may be perceived as being anywhere within a notional listening space, said apparatus comprising:

means for calculation first gain contributions, said first gain contributions making a predominant contribution when said perceived position is close to the notional listening position;

means for calculating second gain contributions, said second gain contributions making a predominant contribution when said perceived position is not close to the notional listening position; and means for combining respective first gain contributions with respective second gain contributions to produce a combined gain value for each output channel;

wherein the first gain contribution there is inversely with the distance between the notional listening position and the notional sound source position raised to a predetermined power; and wherein said means for calculating first gain contributions is arranged to cube said distance such that said first gain characteristic varies inversely with the cube of displacement between the notional sound source and the respective sound generating means.

12. Apparatus for processing audio signals, in which direct acoustic path gain values are calculated for a plurality of channels so that, from a notional listening position, a notional sound source may be perceived as being anywhere within a notional listening space, said apparatus comprising:

means for calculating first direct acoustic path gain contributions, said first direct acoustic path gain contributions making a predominant contribution when said perceived position is close to the notional listening position;

means for calculating second direct acoustic path gain contributions, said second direct acoustic path gain contributions making a predominant contribution when said perceived position is not close to the notional listening position; and means for combining respective first gain contributions with respective second gain contributions to produce a combined gain value for each output channel.

13. Apparatus according to claim 12, wherein the first gain contribution there is inversely with the distance between a notional listening position and the notional sound source position raised to a predetermined power.

14. Apparatus according to claim 12, including means for calculating first gain contributions for all sound generating means.

15. Apparatus according to claim 12, wherein said second gain calculation means is arranged to calculate second gain contributions that vary as a function of the angle between the notional sound source and the respective sound generating means with respect to a position of a notional listener.

16. Apparatus according to claim 15, wherein said function is the cosine of said angle.

17. Apparatus for processing audio signals, in which an inner listening space is bounded by a plurality of sound generating devices, a notional listening position is located within said listening space, and a notional sound source may be perceived from the notional listening position as being anywhere within said listening space, said apparatus comprising:

calculating means for calculating a first gain value for a first sound generating means, wherein said gain value includes one component which varies inversely with distance between the notional sound source and said notional listening position raised to a predetermined power and another component which varies inversely with said distance;

calculating means for calculating a second gain value for a second sound generating means, wherein said second gain value includes one component which varies inversely with distance between the notional sound source and said notional listening position raised to a predetermined power and another component which varies inversely with said distance; and calculating means for calculating a third gain value for a third sound generating means, wherein said third gain value includes one component which varies inversely with distance between the notional sound source and said notional listening position raised to a predetermined power and another component which varies inversely with said distance.

18. Apparatus according to claim 17, further comprising:

fourth calculating means for calculating a fourth gain value for a fourth sound generating means, wherein said fourth gain value varies inversely with distance between the notional sound source and said notional listening position raised to a predetermined power.

19. Apparatus according to claim 18, further comprising:

fifth calculating means for calculating a fifth gain value for a fifth sound generating means, wherein said fifth gain value varies inversely with distance between the notional sound source and said notional listening position raised to a predetermined power.

20. Apparatus for processing audio signals, in which an inner listening space is bounded by a plurality of sound generating devices, a notional listening position is located within said listening space, and a notional sound source may be perceived from a notional listening position as being anywhere within said listening space, said apparatus comprising:

calculating means for calculating a first gain value for a first sound generating means, wherein said gain value varies inversely with distance between the notional sound source and said notional listening position raised to a predetermined power;

calculating means for calculating a second gain value for a second sound generating means, wherein said second gain value varies inversely with distance between the notional sound source and said notional listening position raised to a predetermined power; and calculating means for calculating a third gain value for a third sound generating means, wherein said third gain value varies inversely with distance between the notional sound source and said notional listening position raised to a predetermined power;

wherein said distances are cubed, such that said respective gain values vary inversely with the cube of displacement between the notional sound source and the notional listening position.

21. A method for processing audio signals in which an inner listening space is bounded by a plurality of sound generating devices, a notional listening position is located within the inner listening space and a notional sound source may be perceived from the notional listening position as being anywhere within the listening space by generating different direct acoustic path gain contributions for each said sound generating device, each said direct acoustic path gain contribution varies inversely but in accordance with at least two respectively difference functions with the distance between the notional sound source and the notional listening position;

wherein one of the difference functions makes a predominant contribution when the notional sound source is close to the notional listening position, and another one of the different functions makes predominant contribution when the notional sound source is not close to the notional listening position.

22. Apparatus for processing audio signals in which:

an inner listening space is bounded by a plurality of sound generating devices, a notional listening position is located within the inner listening space; and means are provided for causing a notional sound source to be perceived from the notional listening position as being anywhere within the listening space by generating different direct acoustic path gain contributions for each said sound generating device, each said direct acoustic path gain contribution varies inversely but in accordance with at least two respectively difference functions with the distance between the notional sound source and the notional listening position;

wherein one of the difference functions makes a predominant contribution when the notional sound source is close to the notional listening position, and another one of the different functions makes predominant contribution when the notional sound source is not close to the notional listening position.

* * * * *